United States Patent
Lamorey et al.

(10) Patent No.: US 9,543,254 B2
(45) Date of Patent: Jan. 10, 2017

(54) CHAMFERED CORNER CRACKSTOP FOR AN INTEGRATED CIRCUIT CHIP

(71) Applicant: GLOBALFOUNDRIES INC., Grand Cayman (KY)

(72) Inventors: Mark C. Lamorey, South Burlington, VT (US); David B. Stone, Jericho, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 11 days.

(21) Appl. No.: 14/711,109

(22) Filed: May 13, 2015

(65) Prior Publication Data
US 2015/0255405 A1    Sep. 10, 2015

Related U.S. Application Data

(62) Division of application No. 13/276,383, filed on Oct. 19, 2011, now Pat. No. 9,059,191.

(51) Int. Cl.
| H01L 23/00 | (2006.01) |
| H01L 23/58 | (2006.01) |
| H01L 21/768 | (2006.01) |

(52) U.S. Cl.
CPC ....... *H01L 23/562* (2013.01); *H01L 21/76802* (2013.01); *H01L 21/76877* (2013.01); *H01L 23/585* (2013.01); *H01L 2924/0002* (2013.01); *H01L 2924/10253* (2013.01); *H01L 2924/14* (2013.01)

(58) Field of Classification Search
CPC .............................. H01L 23/562; H01L 23/585
See application file for complete search history.

(56) References Cited

U.S. PATENT DOCUMENTS

| 5,831,330 A * | 11/1998 | Chang .................. H01L 23/585 257/619 |
| 5,834,829 A * | 11/1998 | Dinkel ................... H01L 21/78 257/508 |
| 6,022,791 A * | 2/2000 | Cook .................... H01L 21/768 257/E21.575 |

(Continued)

OTHER PUBLICATIONS

U.S. Appl. No. 13/276,383, Office Action dated Dec. 20, 2013, 6 pages.

(Continued)

*Primary Examiner* — David Zarneke
(74) *Attorney, Agent, or Firm* — Gibb & Riley, LLC; David A. Cain, Esq.

(57) ABSTRACT

A corner crackstop is formed in each of the four corners of an integrated circuit (IC) chip, in which the corner crackstop differs structurally from a portion of the crackstop disposed along the sides of the IC chip. Each corner crackstop includes a plurality of layers, formed on a top surface of a silicon layer of the IC chip, within a perimeter boundary region that comprises a triangular area, in which a right angle is disposed on a bisector of the corner, equilateral sides of the triangle are parallel to sides of the IC chip, and the right angle is proximate to the corner relative to a hypotenuse of the triangle. The plurality of layers of the corner crackstop include crackstop elements, each comprising a metal cap centered over a via bar, in which the plurality of layers of the corner crackstop is chamfered to deflect crack ingress forces by each corner crackstop.

6 Claims, 5 Drawing Sheets

(56) References Cited

U.S. PATENT DOCUMENTS

| | | | |
|---|---|---|---|
| 6,137,155 A * | 10/2000 | Seshan | H01L 23/5226 |
| | | | 257/620 |
| 6,163,065 A | 12/2000 | Seshan et al. | |
| 6,365,958 B1 * | 4/2002 | Ibnabdeljalil | H01L 23/562 |
| | | | 257/619 |
| 6,431,961 B1 | 8/2002 | Katayama et al. | |
| 6,812,576 B1 * | 11/2004 | Fazelpour | H01L 23/49827 |
| | | | 257/774 |
| 7,265,436 B2 * | 9/2007 | Huang | H01L 23/562 |
| | | | 257/483 |
| 7,314,811 B2 | 1/2008 | Tan et al. | |
| 7,498,660 B2 * | 3/2009 | Kumagai | H01L 21/78 |
| | | | 257/620 |
| 7,741,196 B2 | 6/2010 | Yip et al. | |
| 7,790,577 B2 | 9/2010 | Liu et al. | |
| 7,791,070 B2 | 9/2010 | Huang et al. | |
| 8,472,547 B2 | 6/2013 | Hammarwall et al. | |
| 9,406,608 B2 * | 8/2016 | Cho | H01L 21/784 |
| 2005/0263855 A1 * | 12/2005 | Fu | H01L 23/544 |
| | | | 257/620 |
| 2007/0001300 A1 * | 1/2007 | Kohjiro | H01L 23/04 |
| | | | 257/728 |
| 2007/0069336 A1 * | 3/2007 | Ning | H01L 23/585 |
| | | | 257/619 |
| 2007/0145567 A1 * | 6/2007 | Ning | H01L 23/562 |
| | | | 257/691 |
| 2008/0191205 A1 * | 8/2008 | Tsai | H01L 22/34 |
| | | | 257/48 |
| 2008/0258266 A1 * | 10/2008 | Takemura | H01L 23/562 |
| | | | 257/620 |
| 2010/0078769 A1 | 4/2010 | West et al. | |
| 2010/0109128 A1 * | 5/2010 | West | H01L 23/562 |
| | | | 257/620 |
| 2010/0133669 A1 * | 6/2010 | Jao | H01L 21/78 |
| | | | 257/669 |
| 2010/0207251 A1 | 8/2010 | Yu et al. | |
| 2011/0068435 A1 * | 3/2011 | Hudson | H01L 23/562 |
| | | | 257/620 |
| 2011/0147895 A1 * | 6/2011 | Bai | H01L 23/562 |
| | | | 257/618 |
| 2011/0278722 A1 * | 11/2011 | Miki | H01L 23/562 |
| | | | 257/737 |
| 2014/0264901 A1 * | 9/2014 | Saito | G06F 17/5068 |
| | | | 257/773 |
| 2015/0048517 A1 * | 2/2015 | Keser | H01L 23/562 |
| | | | 257/774 |
| 2015/0325531 A1 * | 11/2015 | Dyer | H01L 23/481 |
| | | | 257/620 |

OTHER PUBLICATIONS

U.S. Appl. No. 13/276,383, Office Action dated Mar. 27, 2014, 8 pages.
U.S. Appl. No. 13/276,383, Office Action dated Aug. 28, 2014, 13 pages.
U.S. Appl. No. 13/276,383, Notice of Allowance dated Apr. 8, 2015, 9 pages.

* cited by examiner

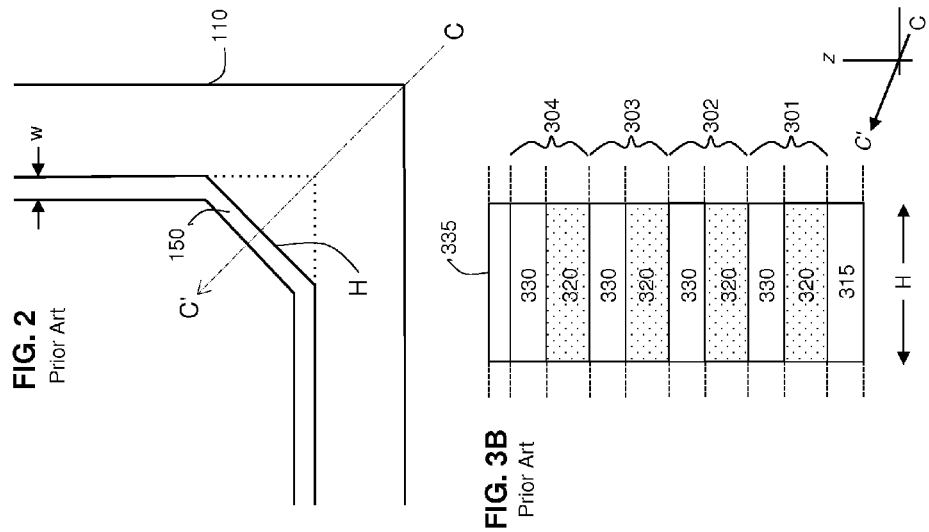
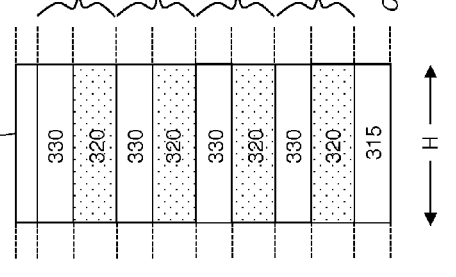
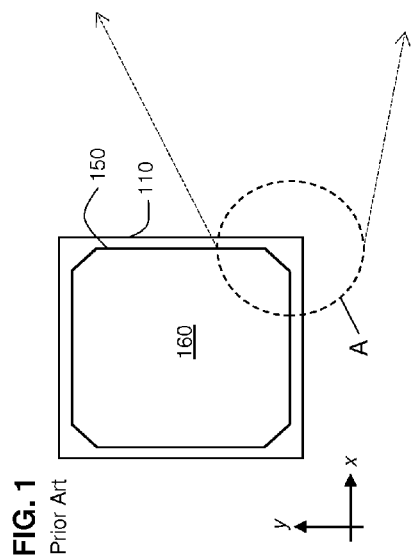
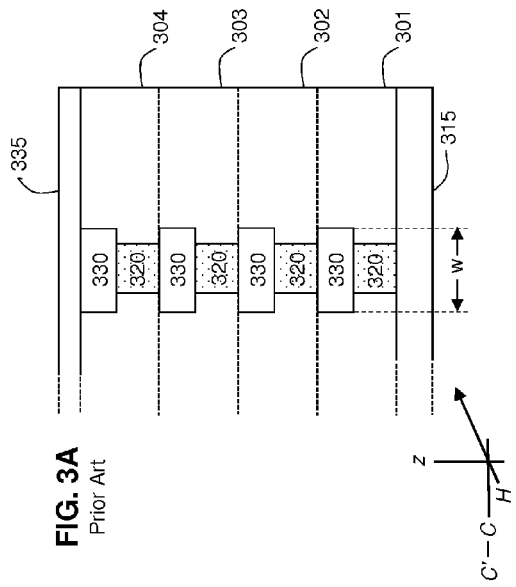

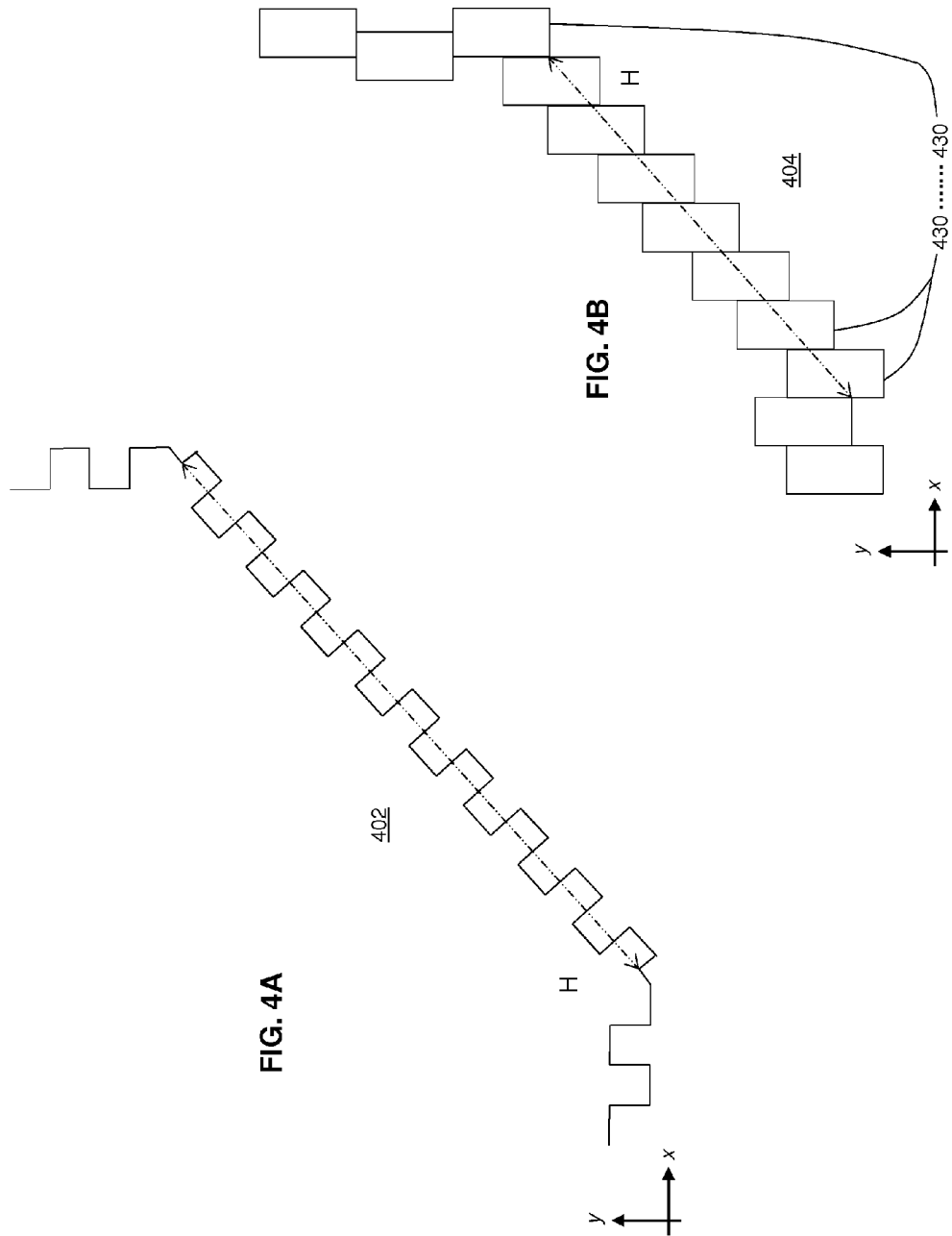

CHAMFERED CORNER CRACKSTOP FOR AN INTEGRATED CIRCUIT CHIP

CROSS-REFERENCE TO RELATED APPLICATIONS

The present invention claims the benefit under 35 U.S.C. §120 as a divisional of presently pending U.S. patent application Ser. No. 13/276,383 filed on Oct. 19, 2011, now issued as U.S. Pat. No. 9,059,191 on Jun. 16, 2015, the entire teachings of which are incorporated herein by reference.

BACKGROUND

The exemplary embodiments generally relate to a corner crackstop and a method of making the corner crackstop in each of the four corners of an integrated circuit (IC) chip, in which the corner crackstop differs structurally from a portion of the crackstop disposed along the sides of the IC chip. More specifically, each corner crackstop includes a plurality of layers disposed between a silicon layer and a final passivation layer of the IC chip. The plurality of layers of the corner crackstop include crackstop elements, each comprising a metal cap centered over a via bar. Yet more specifically, the plurality of layers of the corner crackstop is chamfered to deflect crack ingress forces by each corner crackstop.

DESCRIPTION OF RELATED ART

In manufacturing semiconductor devices, a number of integrated circuits (ICs) are simultaneously prepared on a semiconductor wafer by conventional photolithography techniques. The ICs, which are rectangular in shape, are disposed in a grid pattern on the semiconductor wafer. Each of the four sides of each individual IC is adjacent to a dicing lane. The individual ICs are singulated by dicing the wafer along the dicing lanes with either a saw or laser to form IC chips or dies.

An individual IC chip includes an active region that comprises active and passive electrical devices, which provide the IC's functionality, and a perimeter boundary region that is adjacent to the dicing lanes. The active and passive electrical devices are formed within the semiconductor layer of the active region, which is located behind a crackstop that separates the active region from the perimeter boundary region. The IC chip, including both the active region and the perimeter boundary region, is covered by a plurality of metallization layers, each of the metallization layers including a patterned intermetallic dielectric layer that includes vias and an overlaying patterned metal layer. Within the active region, each of the plurality of metallization layers includes electrical contacts, formed within the vias that contact the overlying patterned metal layer. The patterned metal layer forms interconnect with the electrical contacts to the underlying active and passive electrical devices of the semiconductor layer.

Upon dicing, the IC chip is subject to crack ingress forces along its sides and greater crack ingress forces at the corners. Conventionally, a crackstop is formed parallel to the rectangular perimeter of the IC chip to prevent the crack ingress forces from delaminating or cracking the electrical devices and the metallization layers of the active region. A crackstop includes a plurality of layers formed on the silicon layer of the perimeter boundary region, each layer being formed by processes identical to those used in forming the metallization layers of the active region of the IC chip.

FIG. 1 illustrates a top view, in the x-y plane, of a conventional crackstop 150, disposed on an IC chip 110, in which an overlying final passivation layer is removed to view crackstop 150. The crackstop 150 includes portions that are beveled in the corner regions of the IC chip 110 to provide greater protection to the active region 160 from the greater ingress crack forces at the corners. The portions of the crackstop 150 that parallel the sides of the IC chip 110 and those portions of the crackstop 150 that are beveled in the corner regions include the same plurality of layers and the same structural elements within each layer.

FIG. 2 illustrates, in greater detail, a top view of corner region A (dotted lines) of FIG. 1. Referring to FIG. 2, a beveled portion of the crackstop 150 defines a hypotenuse, H, in the x-y plane, of a triangular area that is further defined by two right-angled sides (dotted lines), which extend from those portions of the crackstop 150 that parallel the sides of the IC chip 110. This triangular area, which forms the perimeter boundary region of each of the four corner regions of IC chip 110, provides greater protection to the active region 160 from the greater ingress crack forces generated at the corners, when compared to a crackstop that parallels the rectangular perimeter of an IC chip. In FIG. 2, a construction line, C-C', in the x-y plane, extends from a corner of the IC chip 110 to cross the beveled portion of the crackstop 150 at a right angle.

Referring to FIGS. 3A and 3B, FIG. 3A illustrates a cross-section of crackstop 150 in a plane defined by the z-axis and construction line C-C', as viewed along the hypotenuse, H, shown in FIG. 2, while FIG. 3B illustrates another cross-section of crackstop 150 in a plane defined by the z-axis and the hypotenuse, H, as viewed from C of the construction line C-C', i.e., from the corner of the IC chip 110 toward the center of the IC chip 110. Crackstop 150 is formed on the silicon layer 315 of the IC chip 110 by, for example, four layers, 301-304, each layer comprising crackstop elements that include a metal cap 320 centered above a via bar 310. The via bar 320 differs from a conventional contacting cylindrical via by having a length, oriented along H, that exceeds its width.

Processes identical to those that form the metallization layers of the active region 160 of the IC chip 110 simultaneously form each layer of crackstop 150. Each metallization layer of the active region 160 comprises a patterned metal layer, which corresponds to the metal cap 320 of a layer of crackstop 150, and electrical contacts, formed within the intermetallic dielectric layer, which correspond to the via bar 320. These processes of simultaneously forming the metallization layers of the active region 160 and the layers of crackstop 150 include: deposition of an intermetallic dielectric on a silicon substrate in the active region 160 and the perimeter boundary region; patterning the intermetallic dielectric to form vias in the active region 160 and via bars in the perimeter boundary region; filling the vias with metal to form electrical contacts in the active region 160 and the via bars with metal to form part of a crackstop element in the perimeter boundary region; and depositing and patterning a metal layer over the electrical contacts and intermetallic dielectric to form interconnects between the electrical contacts in the active region 160 and over the via bars and intermetallic dielectric to form overlying metal caps on the via bars in the perimeter boundary region.

In contrast to the electrical contacts and the patterned metal interconnects of the active region 160, the metal caps 330 and via bars 320 of the crackstop 150 do not electrically contact any of the active or passive electrical devices in the active region 160 of the IC chip 110. Instead, the metal caps 330 and via bars 320 of the crackstop 150 perform a mechanical function of preventing the ingress of crack forces to the active region 160 located behind crackstop 150 of IC chip 110.

Referring to FIG. 3B, each metal cap 330 and via bar 320 of the beveled portion of the crackstop 150 extends the length of the hypotenuse, H, and joins the metal caps and via bars, at an approximately 45° angle, of the metal cap and via bar structures of those portions of the crackstop 150, which parallel the sides of the IC chip 110. Thus, the vertically aligned crackstop elements of the beveled portions of the crackstop 150, i.e., a metal cap 330 centered over a via bar 320, are the same as those vertically aligned crackstop elements, i.e., a metal cap centered over a via bar, of those portions of the crackstop 150, which are parallel to the sides of the IC chip 110. Viewed from C of the C-C' construction line shown in FIG. 2, the metal caps 330 and via bars 320 of the layers of the beveled portion of the crackstop 150, illustrated in FIG. 3B, form a vertical metal "wall", between the silicon layer 305 and the final passivation layer 335 that prevents the ingress of crack forces in the corner region. Those areas (dotted lines) to the right and left of the metal caps 330 and the via bars 320 of FIG. 3B, represent the same metal cap and via bar structures of those portions of the crackstop 150, which parallel the sides of the IC chip 110. FIG. 3A shows that this vertical metal "wall" comprises a plurality of layers, each layer including crackstop elements of a metal cap 330 centered above a via bar 320, where the metal caps 330 and via bars 320 are vertically aligned among all of the layers 301-304.

Although the top view of FIG. 2 shows the beveled portion of conventional crackstop 150 comprising a rectilinear structure oriented along the angle of the hypotenuse, H, an outward-facing surface of the rectilinear angled structure can be "broken up" into a zigzag pattern 402 of structural elements, as shown in FIG. 4A. It is thought that the zigzag pattern 402 helps to "break up" the ingress of crack forces into the corner region. The zigzag pattern 402 can be extended to those portions of the crackstop, which are parallel to the sides of the IC chip. Referring to FIG. 4A, individual crackstop elements, each including a metal cap centered over a via bar that is oriented parallel to a beveled portion of the corner crackstop, can form zigzag pattern 402. Alternatively, a semiconductor manufacturing process may approximate a rectilinear angled structure by forming a right-angled zigzag pattern of crackstop elements along the x-y axes of the IC chip, as shown in FIG. 4B, to form an outward-facing surface of the corner crackstop. Referring to FIG. 4B, individual rectangular corner crackstop elements 430, each including a metal cap centered over a via bar that is oriented along the x-y axes of the IC chip, can form right-angled zigzag pattern 404, which approximates the rectilinear beveled portion of a corner crackstop. Again, it is thought that the zigzag pattern 404 helps to "break up" the ingress of crack forces into the corner region.

There remains a need to maximize crack stopping robustness without decreasing the active region of an IC chip, which is protected by a conventional crackstop having beveled portions in the corner regions, where the same vertically aligned crackstop elements are formed in the beveled portions of the conventional crackstop and in those portions of the conventional crackstop that are parallel to the sides of the IC chip.

SUMMARY

In view of the foregoing, an exemplary embodiment of the invention disclosed herein provides a corner crackstop including: a plurality of n layers formed on a silicon layer of an integrated circuit (IC) chip within a perimeter boundary region of a corner of the IC chip, each layer including a number of crackstop elements, each crackstop element having a same width and including a metal cap centered on a via bar. The perimeter boundary region is disposed on a top surface of the silicon layer and comprises a triangle, a right angle of the triangle being disposed on a bisector of the corner, equilateral sides of the triangle being parallel to sides of the IC chip, and the right angle being proximate to the corner relative to a hypotenuse of the triangle. A first crackstop element of a first layer is disposed proximately to the right angle of the triangle, oriented in parallel to the hypotenuse, and has a smallest length limited by the equilateral sides. A second crackstop element of the first layer adjoins the first crackstop element and has a greater length limited by the equilateral sides, and an nth crackstop element of the first layer adjoins an (n−1)th crackstop element and has a greatest length limited by the equilateral sides. A first crackstop element of a second layer is vertically aligned over the second crackstop element of the first layer and has the greater length, and an (n−1)th crackstop element of the second layer is vertically aligned over the nth crackstop element of the first layer and has the greatest length, and a single crackstop element of an nth layer is vertically aligned over a second crackstop element of an (n−1)th layer and has the greatest length.

Another exemplary embodiment disclosed herein provides a corner crackstop including: a plurality of n layers formed on a silicon layer of an integrated circuit (IC) chip within a perimeter boundary region of a corner of the IC chip, each layer including a number of crackstop elements, each crackstop element having a same width and including at least one metal cap disposed on a via bar of width, w. The perimeter boundary region is disposed on a top surface of the silicon layer and comprises a triangle, a right angle of the triangle is disposed on a bisector of the corner, equilateral sides of the triangle are parallel to sides of the IC chip, and the right angle is proximate to the corner relative to a hypotenuse of the triangle. A crackstop element of a first layer is disposed proximately to the right angle of the triangle, oriented in parallel to the hypotenuse, and has a smallest length limited by the equilateral sides. A crackstop element of a second layer is disposed more distally from the right angle than the crackstop element of the first layer by a distance of less than ½ w, along the bisector, oriented in parallel to the hypotenuse, and has a greater length limited by the equilateral sides. A crackstop element of an nth layer is disposed more distally from the right angle than the crackstop element of the (n−1)th layer by the distance along the bisector, oriented in parallel to the hypotenuse, and has a greatest length limited by the equilateral sides.

Yet another exemplary embodiment disclosed herein provides a method of making a corner crackstop including forming a plurality of n layers on a silicon layer of an integrated circuit (IC) chip within a perimeter boundary region of a corner of the IC chip, each layer including a number of crackstop elements, each crackstop element having a same width and including at least one metal cap centered on a corresponding at least one via bar, the at least one via bar having a width, w. The perimeter boundary region is defined on a top surface of the silicon layer that comprises a triangle, a right angle of the triangle being disposed on a bisector of the corner, equilateral sides of the triangle being parallel to sides of the IC chip, and the right angle being proximate to the corner relative to a hypotenuse of the triangle. The method further includes: forming a crackstop element of a first layer disposed proximately to the right angle of the triangle, oriented in parallel to the hypotenuse, and having a smallest length limited by the equilateral sides. The method further includes forming a crackstop element of a second layer disposed more distally from the right angle than the crackstop element of the first layer by one of: a distance equal to the width of a crackstop element, and a distance less than ½ w of the via bar, along the bisector, being oriented in parallel to the hypotenuse, and having a greater length limited by the equilateral sides. The method further includes forming a crackstop element of an nth layer disposed more distally from the right angle than a crackstop element of a (n−1)th layer by the one distance, along the bisector, being oriented in parallel to the hypotenuse, and having a greatest length limited by the equilateral sides.

BRIEF DESCRIPTION OF THE DRAWINGS

The embodiments herein will be better understood from the following detailed description with reference to the drawings, which are not necessarily drawn to scale and in which:

FIG. 1 is a schematic diagram illustrating a top view of conventional crackstop on an integrated circuit (IC) chip in the related art;

FIG. 2 is a schematic diagram illustrating, in more detail, a top view of a beveled corner region of the conventional crackstop of FIG. 1 in the related art;

FIG. 3A is a schematic diagram illustrating a cross-section viewed along the hypotenuse, H, of the beveled corner region of the conventional crackstop of FIG. 2 in the related art;

FIG. 3B is a schematic diagram illustrating another cross-section viewed from C of the construction line C-C', of the beveled corner region of the conventional crackstop of FIG. 2 in the related art;

FIG. 4A is a schematic diagram illustrating a top view of a beveled portion of a conventional crackstop, including crackstop elements that form a zigzag pattern parallel to the beveled portion in the related art;

FIG. 4B is a schematic diagram illustrating a top view of a beveled portion of a conventional crackstop, including crackstop elements that are oriented parallel to the x-y axes of the IC chip and form a zigzag pattern, which approximates the orientation of the beveled portion in the related art;

DETAILED DESCRIPTION

Figure 5:
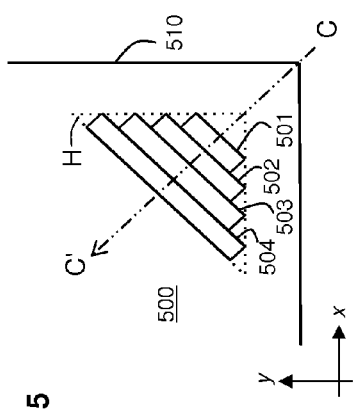
FIG. 5 is a schematic diagram illustrating a top view of a corner crackstop on an IC chip in an exemplary embodiment.

The exemplary embodiments of the invention and the various features and advantageous details thereof are explained more fully with reference to the non-limiting exemplary embodiments that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary embodiments of the invention. The examples used herein are intended to merely facilitate an understanding of ways in which the exemplary embodiments of the invention may be practiced and to further enable those of skill in the art to practice the exemplary embodiments of the invention. Accordingly, the examples should not be construed as limiting the scope of the exemplary embodiments of the invention.

As described above, there remains a need to maximize crack stopping robustness without decreasing the active region of an IC chip, which is protected by a conventional crackstop having beveled portions in the corner regions, where the same vertically aligned crackstop elements are formed in the beveled portions of the conventional crackstop and in those portions of the conventional crackstop that are parallel to the sides of the IC chip.

FIG. 5 illustrates a top view, in the x-y plane, of an exemplary embodiment of a corner crackstop 500 in a corner region of an IC chip 510, where an overlying final passivation is removed. In the exemplary embodiment, the corner crackstop may comprise, for example, four stepped layers 501-504. The first layer of the corner crackstop is formed on the silicon layer of the IC chip 510. The number of layers of the corner crackstop equals the number of metallization layers formed within the active region of the IC chip 510 and spans the height between the underlying silicon layer and the final passivation layer of the IC chip 510. In various embodiments, the number of layers, n, in the corner crackstop may range from 3 to 12.

Referring to FIG. 5, an exemplary embodiment of a corner crackstop 500 may be formed within a triangular area of the perimeter boundary region, indicated by the dotted lines, which is proximate to a corner of the IC chip 510. The triangular area, which is disposed on a top surface of the silicon layer of the IC chip, may be defined by a right angle disposed on a construction line C-C' that bisects the corner of the IC chip 510 and equilateral sides that parallel the sides of the IC chip 510. In an exemplary embodiment, some crackstop elements of the corner crackstop 500 may contact those portions of the crackstop (not shown) that are parallel to the sides of the IC chip 510.

Figure 6B:
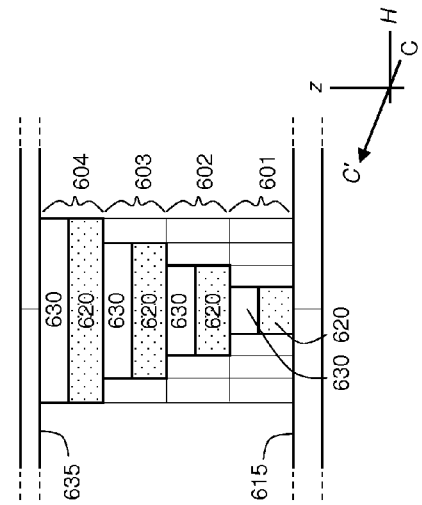
FIG. 6B is a schematic diagram illustrating another cross section viewed from C of the construction line C-C', of a corner region including the corner crackstop of FIG. 5 in the exemplary embodiment.
Figure 6A:
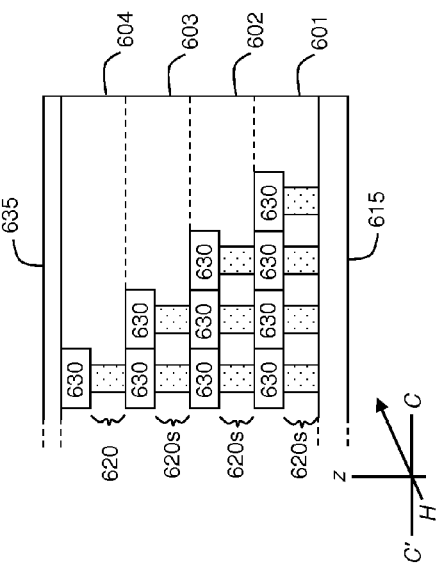
FIG. 6A is a schematic diagram illustrating a cross section viewed along the hypotenuse, H, of a corner region including the corner crackstop of FIG. 5 in the exemplary embodiment.

Referring to FIGS. 6A and 6B, FIG. 6A illustrates a cross-section of the corner crackstop 500 of FIG. 5 in a plane defined by the z-axis and the construction line C-C', while FIG. 6B, by removing any overlying intermetallic dielectric formed on the corner crackstop 500 that overlies the silicon layer 615 of the IC chip, illustrates a perspective along the construction line C-C' from C to C' that views successive planes defined by the z-axis and crackstop elements of each of the four stepped layers, 501-504 of FIG. 5, which parallel the hypotenuse, H.

Referring to FIG. 6A, in the first layer 601 of the corner crackstop 500, a first right-most crackstop element, comprising a metal cap 630 centered over a via bar 620, may be disposed proximately to C of the construction line C-C'. A top view of the first right-most crackstop element of the first layer 601 corresponds to 501 of FIG. 5. Referring to FIG. 6A, in the first layer 601 of the corner crackstop 500, a second right-most corner crackstop element, comprising its metal cap 630 centered on via bar 620, may adjoin the first right-most crackstop element on a side surface that is distal from C. Because all of the crackstop elements are of equal width, as measured along the construction line C-C', the second right-most crackstop element will necessarily parallel the first right-most crackstop element in the first layer 601. However, the length, as measured parallel to H, of the second right-most crackstop element in the first layer 601, and its metal bar 630 centered on via bar 620, may be greater than that of the first right-most crackstop element because the equilateral sides of the triangular area determine the length of the second right-most crackstop element.

Similarly, a left-most nth crackstop element of the first layer 601 may adjoin an (n−1)th crackstop element of the first layer 601. The left-most nth crackstop element, and its metal cap 630 centered on via bar 620, may have a greatest length, as measured parallel to H, of the crackstop elements in the first layer 601 because it is closest to the longest side, i.e., the hypotenuse, H, of the triangular area.

Referring to FIG. 6A, a right-most crackstop element of the second layer 602, comprising a metal cap 630 centered over a via bar 620, may be vertically aligned over the second right-most crackstop element of the first layer 501 and have a length, as measured parallel to H, equal to that of the second right-most crackstop element of the first layer 601. A top view of the right-most crackstop element of the second layer 602 corresponds to 502 of FIG. 5. Similarly, a left-most crackstop element of the second layer 602, and its metal cap 630 centered on a via bar 620, may be vertically aligned over the left-most crackstop element of the first layer 601 and have a length equal to the greatest length of the crackstop elements in the triangular area.

Referring to FIG. 6A, a single crackstop element of the topmost or nth layer, comprising a metal cap 630 centered on a via bar 620, may be vertically aligned over a left-most crackstop element of the (n−1)th layer and its metal cap 630 centered on a via bar 620, and have a length equal to that of the greatest length of the crackstop elements. A top view of the single topmost or nth layer crackstop element corresponds to 504 of FIG. 5. In fact, the left-most crackstop element, and its metal cap 630 centered on via bar 620, of every layer of the corner crackstop will have a length equal to that of the greatest length of the crackstop elements in the corner crackstop 500.

Referring to FIG. 6A, the width, as measured along the construction line C-C', of each crackstop element may be equal to the width of the metal cap 630, and the width of via bar 620 may be less than that of the metal cap 630. Each metal cap 630 may comprise a metal and each via bar may comprise a metal. None of the metal caps 630 and via bars 620 of any of the crackstop elements, formed in any of the layers of the corner crackstop 500, may contact an electrical device within an active region of the IC chip 510 of FIG. 5. A top surface of the corner crackstop 500 may contact an overlying final passivation layer 635.

Referring to FIG. 6B, by removing any overlying intermetallic dielectric formed on the corner crackstop 500, the length, as measured parallel to H, of each metal cap 630 and via bar 620 for each of the exemplary layers 601-604, which correspond to the stepped layers 501-504 of FIG. 5, may be viewed from the perspective of C of the construction line C-C' toward the interior of the IC chip 510. The foremost surface, i.e., closest to the corner of the IC chip 510, defined by the broad black lines identifying the metal cap 630 and via bar 620 of layer 601, corresponds to foremost surface of 501, i.e., closest to the corner of the IC chip 510, and may have the smallest length, as measured parallel to H. Stepping away from the corner of IC chip 510 toward the center of IC chip 510, the length of the uppermost crackstop elements of the second layer 602, defined by the broad black lines identifying the metal cap 630 and via bar 620, may increase. Similarly, stepping to the third layer 603, the length of the uppermost crackstop elements of the third layer 603 may increase relative to the length of the uppermost crackstop elements of the second layer 602. Finally, the length of the uppermost crackstop elements of the topmost layer, e.g., layer 604, may have the greatest length. Thus, the corner crackstop 500 may be characterized as forming a stepped chamfered surface, comprising the uppermost crackstop elements of each layer, disposed above the triangular area of a corner region of IC chip 510.

Although FIG. 5 shows the corner crackstop 500 comprising rectilinear structures oriented parallel to the hypotenuse, H, of the triangular area, the structures 501-504 may, instead, form outward-facing surfaces of a zigzag pattern comprising corner crackstop elements oriented either in parallel to the hypotenuse, H, or in parallel to the x-y axes of the IC chip 510, to help "break up" inwardly-directed crack forces.

Figure 7:
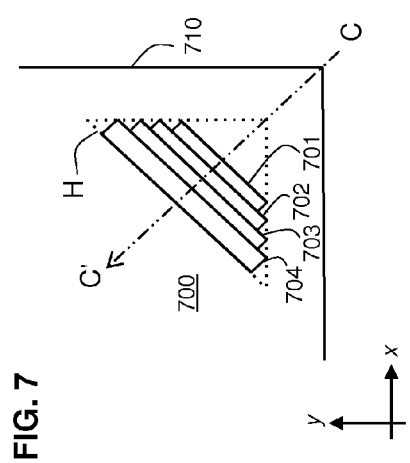
FIG. 7 is a schematic diagram illustrating a top view of a corner crackstop on an IC chip in another exemplary embodiment.

FIG. 7 illustrates a top view, in the x-y plane, of another exemplary embodiment of a corner crackstop 700 in a corner region of an IC chip 710, where an overlying final passivation is removed. Referring to the corner crackstop 700 of FIG. 7, a crackstop element of a second layer 702 may overlie a part of a width, as measured along a construction line C-C', along the length, as measured parallel to H, of a crackstop element of a first layer 701, a crackstop element of a third layer 703 may likewise overlie a part of a width, as measured along the construction line C-C', along the length, as measured parallel to H, of the crackstop element of the second layer 702, and so on, until the topmost crackstop element of the topmost or nth layer may overlie a part of the width along the length of the crackstop element of an underlying layer. In the exemplary embodiment, the corner crackstop may comprise, for example, four stepped layers 701-704. The number of layers of the corner crackstop 700 may equal the number of metallization layers formed within the active region of the IC chip 710, may span the height between the underlying silicon layer and the final passivation layer, and may range from 3 to 12.

Referring to FIG. 7, the exemplary embodiment of corner crackstop 700 may be formed within the triangular area, indicated by the dotted lines and proximate to the corner of IC chip 710. The triangular area, which is disposed on a top surface of the silicon layer of the IC chip 710, may be defined by a right angle disposed on a construction line C-C' that bisects and is proximate to the corner of the IC chip 710, and equilateral sides that parallel the sides of the IC chip 710. In an exemplary embodiment, the corner crackstop 700 may contact those portions of a crackstop (not shown) that are parallel to the sides of the IC chip 710.

Figure 8A:
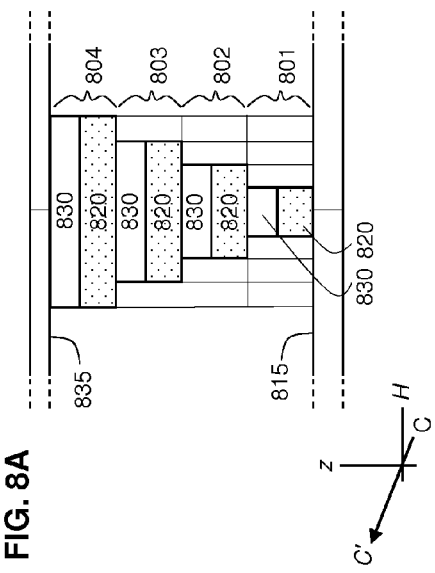
FIG. 8A is a schematic diagram illustrating a cross section viewed from C of the construction line C-C', of a corner region including the corner crackstop of FIG. 7 in the another exemplary embodiment.
Figure 8B:
FIG. 8B is a schematic diagram illustrating another cross section viewed along the hypotenuse, H, of a corner region having a single chamfered structure for the corner crackstop of FIG. 7 in the another exemplary embodiment.

Referring to FIGS. 8A and 8B, FIG. 8A illustrates, by removing any overlying intermetallic dielectric formed on the corner crackstop 700 of FIG. 7, a perspective along the construction line C-C' from C to C' that views successive planes defined by the z-axis and crackstop elements of each of the stepped layers 701-704 of FIG. 7 formed on the silicon layer 815 of the IC chip 710, which parallel the hypotenuse, while FIG. 8B illustrates a cross-section of the corner crackstop 700 in the plane defined by the z-axis and the construction line C-C'.

Referring to FIG. 8A, by removing any overlying intermetallic dielectric formed on the corner crackstop 700, the length, as measured parallel to H, of each metal cap 830 and via bar 820 for each of the exemplary layers 801-804, which correspond to the stepped layers 701-704 of FIG. 7, may be viewed from the perspective of C of the construction line C-C' toward the interior of the IC chip 710. The foremost surface, i.e., closest to the corner of the IC chip 710, defined by the broad black lines identifying the metal cap 830 and via bar 820 of layer 801, corresponds to foremost surface of 701, i.e., closest to the corner of the IC chip 710, and may have the smallest length, as measured parallel to H. Stepping away from the corner of IC chip 710 toward the center of IC chip 710, the length of the crackstop elements of the second layer 802, defined by the broad black lines identifying the metal cap 830 and via bar 820, may increase. Similarly, stepping to the third layer 803, the length of the crackstop elements of the third layer 803 may increase relative to the length of the crackstop elements of the second layer 802. Finally, the length of the crackstop elements of the topmost layer, e.g., layer 804, may have the greatest length. Thus, the corner crackstop 700 may be characterized as forming a stepped chamfered surface, comprising the crackstop elements of each layer, disposed above the triangular area of a corner region of IC chip 710.

Referring to FIG. 8B, a crackstop element of the first layer 801, comprising a metal cap 830 centered over a via bar 820, may be disposed on a top surface of the silicon layer 815 of the IC chip 710 of FIG. 7, proximate to C of the construction line C-C' and parallel to the hypotenuse, H, of the triangular area. A crackstop element of the second layer 802, comprising a metal cap 830 centered over a via bar 820, may be disposed more distally from C of the construction line C-C' than the crackstop element of the first layer 801 by a distance less than ½ w, i.e., one-half the width of a via bar 820. Similarly, the crackstop elements of each successive layer may be disposed more distally from C of the construction line C-C' by a distance of less than ½ w. A crackstop element of the topmost or nth layer, e.g., the fourth layer, 804, of the corner crackstop 700 of FIG. 7 may be more distally disposed from C of the construction line C-C' by a distance of less than ½ w relative to the underlying crackstop element of the (n−1)th layer, e.g., the third layer, 803.

Referring to FIG. 8B, the width, as measured along the construction line C-C', of each crackstop element may be equal to a width of metal cap 830, and the width of the metal cap 830 may greater than that of the width, w, of a via bar 820. Each metal cap 830 may comprise a metal and each via bar 820 may comprise a metal. None of the metal caps 830 and via bars 820 of any of the crackstop elements formed in any of the layers of the corner crackstop 700 may contact an electrical device within an active region of the IC chip 710. A top surface of the corner crackstop 700 may contact an overlying final passivation layer 835.

Although FIG. 7 shows the corner crackstop 700 comprising rectilinear structures oriented parallel to the hypotenuse, H, of the triangular area, the structures 701-704 may, instead, form outward-facing surfaces of a zigzag pattern comprising corner crackstop elements oriented either in parallel to the hypotenuse, H, or in parallel to the x-y axes of the IC chip 710, to help "beak up" inwardly-directed crack forces.

Figure 9:
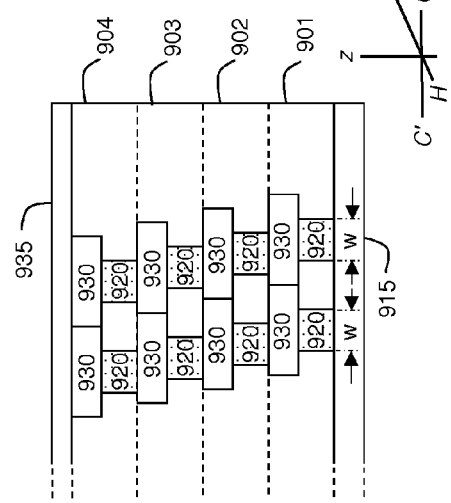
FIG. 9 is a schematic diagram illustrating a cross section viewed along the hypotenuse, H, of a corner region having multiple chamfered structures for a corner crackstop, similar to that of FIG. 7, in another alternative exemplary embodiment.

The exemplary embodiment illustrated by FIG. 9 is similar to that of FIG. 8B, and shows a cross-section in the plane defined by the z-axis and a construction line C-C' of a corner crackstop including multiple crackstop elements in each layer. Referring to FIG. 9, multiple crackstop elements of the first layer 901, each comprising a metal cap 930 centered over a via bar 920, may be disposed on a top surface of a silicon layer 915 of an IC chip, proximate to C of the construction line C-C' and each parallel to the hypotenuse, H, of a triangular area of the perimeter boundary region. Each of the multiple crackstop elements of the second layer 902 may be disposed more distally from C of the construction line C-C' than the corresponding multiple crackstop elements of the first layer 901 by a distance less than ½ w, i.e., one-half the width of a via bar 920 of one of the crackstop elements, where w is measured construction line C-C'. Similarly, each of the multiple crackstop elements of each successive layer may be disposed more distally from C of the construction line C-C' than the corresponding multiple crackstop element of the underlying layer by a distance of less than ½ w. Each of the multiple crackstop elements of the topmost or nth layer, e.g., the fourth layer, 904, of the corner crackstop may be more distally disposed from C of the construction line C-C' by a distance of less than ½ w relative to the underlying corresponding multiple crackstop element of the (n−1)th layer, e.g., the third layer, 903.

Referring to FIG. 9, the width, as measured along the construction line C-C', of each of the multiple crackstop elements, may be equal to a width of metal cap 930, and the width of the metal cap 930 may be greater than the width, w, of a via bar 920. Each metal cap 930 may comprise a metal and each via bar 920 may comprise a metal. None of the metal caps 930 and via bars 920 of any of the crackstop elements formed in any of the layers of the corner crackstop may contact an electrical device within an active region of the IC chip. A top surface of the corner crackstop may contact an overlying final passivation layer 935.

Although the cross-section of FIG. 9 assumes that each of the multiple crackstop elements of each layer, e.g., 901-904, forms a beveled rectilinear structure that parallels the hypotenuse, H, of the triangular area, the overlying structures of layers 901-904 may, instead, form one or more outward-facing surfaces of a zigzag pattern comprising corner crackstop elements oriented either in parallel to the hypotenuse, H, or in parallel to the x-y axes of the IC chip, to help "break up" inwardly-directed crack forces.

Figure 10:
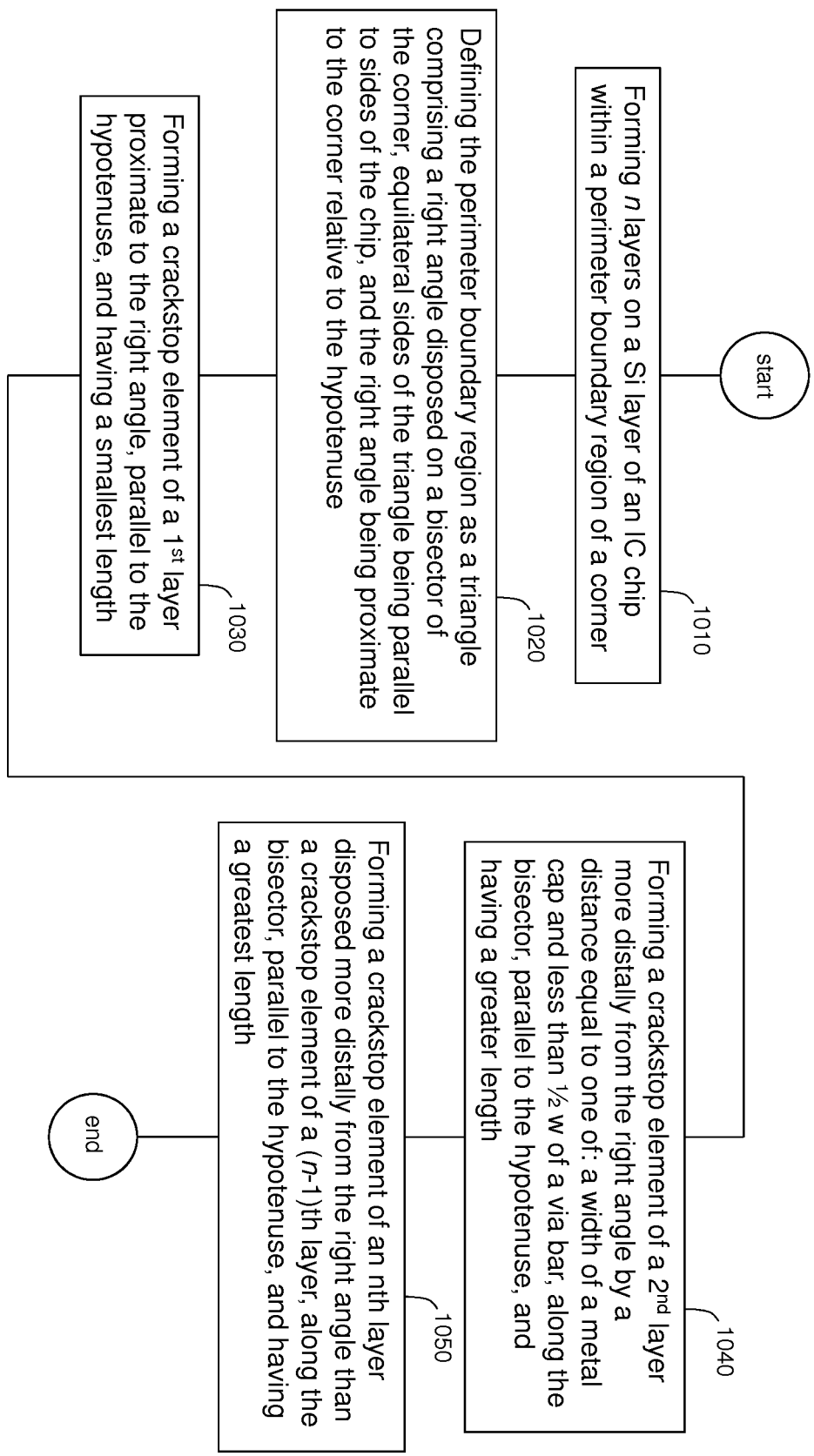
FIG. 10 is a flowchart illustrating a method of making a corner crackstop on an IC chip in an exemplary embodiment.

FIG. 10 illustrates a flowchart that depicts a method of making an exemplary embodiment of a corner crackstop. Process 1010 indicates that a plurality of n layers is formed on a silicon layer of an IC chip within a perimeter boundary region of a corner of the IC chip. Each layer in the process includes a number of crackstop elements, in which each crackstop element has the same width and includes at least one metal cap centered on a corresponding at least one via bar, which has a width, w. The process 1020 defines the perimeter boundary region on a top surface of the silicon layer of the IC chip that comprises a triangle. The triangle includes a right angle that is disposed on a bisector of the corner angle of the IC chip and equilateral sides that are parallel to the sides of the IC chip, where the right angle is proximate to the corner relative to the hypotenuse of the triangle. The process 1030 forms a crackstop element of a first layer, which is disposed proximately to the right angle of the triangle, oriented in parallel to the hypotenuse, and having a smallest length determined and limited by the equilateral sides of the triangle. The process 1040 forms a crackstop element of the second layer, which is disposed more distally from the right angle than the crackstop element of the first layer by a distance equal to the width of a via bar, w, or by a distance less than ½ w, along the bisector, oriented parallel to the hypotenuse, and having a greater length than the smallest length, which is determined and limited by the equilateral sides of the triangle. The process 1050 forms a crackstop element of an nth layer that is more distally disposed from the right angle of the triangle than a crackstop element of a (n−1) layer by the distance equal to the width of a via bar, w, or by the distance less than ½ w, along the bisector, oriented in parallel to the hypotenuse, and having a greatest length limited by the equilateral sides of the triangle.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For purposes herein, a "semiconductor" is a material or element that may include an implanted impurity that allows the material to sometimes be a conductor and sometimes be an insulator, based on electron and hole carrier concentration. For purposes herein, a "dielectric" is a relative term that means a material or element that allows substantially less (<95%) electrical current to flow than does a "conductor." The dielectrics (insulators) mentioned herein can, for example, be grown from either dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance. The conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist) can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the embodiments herein have been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiment was chosen and described in order to best explain the principles of the embodiments and the practical application, and to enable others of ordinary skill in the art to understand the embodiments for various embodiments with various modifications as are suited to the particular use contemplated.

What is claimed is:

1. A corner crackstop comprising:
   a plurality of n metallization layers formed on a silicon layer of an integrated circuit (IC) chip above a perimeter boundary region of a corner of said IC chip, said perimeter boundary region comprising a triangle, a right angle of said triangle being disposed on a bisector of said corner of said IC chip, equilateral sides of said triangle being parallel to sides of said IC chip, and a hypotenuse of said triangle being orthogonal to said bisector; and
   a crackstop element disposed within each of said n metallization layers, each crackstop element being longitudinally oriented in parallel to said hypotenuse, being limited in length by said equilateral sides, and rising step-wise with each of said n metallization layers along said bisector from said right angle,
   a crackstop element of a first layer being disposed proximately to said right angle and having a smallest length limited by said equilateral sides;
   a crackstop element of a second layer being disposed more distally from said right angle than said crackstop element of said first layer, partially overlapping and contacting said crackstop element of said first layer, and having a greater length limited by said equilateral sides; and a crackstop element of an nth layer being disposed yet more distally from said right angle along said bisector than said crackstop element of an (n−1)th layer, partially overlapping and contacting said crackstop element of said (n−1)th layer, and having a greatest length limited by said equilateral sides.

2. The corner crackstop of claim 1, each crackstop element including a via bar and a metal cap, said via bar being formed in an intermetallic dielectric layer of each of said n metallization layers, being longitudinally oriented in parallel to said hypotenuse and having a width, w, measured along said bisector, and said metal cap being formed in a patterned metal layer of each of said n metallization layers, being longitudinally oriented in parallel to said hypotenuse, having a width greater than said width, w, of said via bar and being centered along said bisector over said via bar.

3. The corner crackstop of claim 2, each successively higher crackstop element of each successively higher of said n metallization layers overlapping by a distance of less than ½ w along said bisector from a center of a lower crackstop element.

4. The corner crackstop of claim 3, said metal cap and said via bar of each crackstop element, formed in each of said n metallization layers within said perimeter boundary region, not contacting an electrical device in an active region of said IC chip.

5. The corner crackstop of claim 1, each corner crackstop element of said n metallization layers contacting a portion of another crackstop that is parallel to sides of said IC chip.

6. The corner crackstop of claim 1, a plurality of corner crackstop elements corresponding to said plurality of said n metallization layers proximate to said corner region of said IC chip, forming a stepped chamfered outward-facing surface disposed between side surfaces and between a top surface and said silicon layer of said corner region of said IC chip.

* * * * *